(12) United States Patent
Jeong et al.

(10) Patent No.: US 12,549,657 B2
(45) Date of Patent: Feb. 10, 2026

(54) ELECTRONIC DEVICE COMPRISING PROTECTION MEMBER FOR PROTECTING DISPLAY

(71) Applicant: Samsung Electronics Co., Ltd., Suwon-si (KR)

(72) Inventors: Seongki Jeong, Suwon-si (KR); Chijoon Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 175 days.

(21) Appl. No.: 18/591,772

(22) Filed: Feb. 29, 2024

(65) Prior Publication Data

US 2024/0205323 A1    Jun. 20, 2024

Related U.S. Application Data

(63) Continuation of application No. PCT/KR2022/011305, filed on Aug. 1, 2022.

(30) Foreign Application Priority Data

Sep. 15, 2021    (KR) .................. 10-2021-0123538

(51) Int. Cl.
  *H05K 7/20*    (2006.01)
  *H04M 1/02*    (2006.01)
  *H04M 1/18*    (2006.01)

(52) U.S. Cl.
  CPC ........... *H04M 1/185* (2013.01); *H04M 1/022* (2013.01); *H04M 1/0268* (2013.01)

(58) Field of Classification Search
  CPC ..... H04M 1/022; H04M 1/0268; H04M 1/185
  See application file for complete search history.

(56) References Cited

U.S. PATENT DOCUMENTS 7,450,373 B2 * 11/2008 Lee .................. G06F 1/181
                                                361/679.55
11,425,831 B2    8/2022 Kim et al.
(Continued)

FOREIGN PATENT DOCUMENTS

KR    10-1999-0019589 A    3/1999
KR       20-0187548 Y1    7/2000
(Continued)

OTHER PUBLICATIONS

International Search Report with Written Opinion and English translation dated Nov. 25, 2022; International Appln. No. PCT/KR2022/011305.

(Continued)

*Primary Examiner* — Anthony Q Edwards
(74) *Attorney, Agent, or Firm* — Jefferson IP Law, LLP

(57) ABSTRACT

According to an embodiment, an electronic device includes a first housing, a second housing rotatably coupled to the first housing, a display disposed on the first housing and the second housing, a protective member including a recess disposed along at least a part of edges of the display and including a through hole, a damper supported by the recess, a rod including an end protruding from the damper via the through hole, a fastener contacting a surface of the protective member facing an inner space formed by the first surface, the second surface, and a side surface of the first (Continued)

housing, and combined with an end of the rod, extending from the end of the rod in a radial direction of the through hole, and covering the through hole.

20 Claims, 12 Drawing Sheets

(56) References Cited

U.S. PATENT DOCUMENTS

| | | | |
|---|---|---|---|
| 2009/0231805 A1* | 9/2009 | Schlesener | B29C 45/1676 |
| | | | 428/53 |
| 2013/0003271 A1* | 1/2013 | Obara | A63F 13/98 |
| | | | 361/679.01 |
| 2019/0380217 A1* | 12/2019 | Cosgrove | H04M 1/0268 |
| 2020/0352038 A1 | 11/2020 | Kim et al. | |
| 2021/0004049 A1 | 1/2021 | Park et al. | |
| 2021/0096598 A1 | 4/2021 | Lim | |
| 2021/0116964 A1 | 4/2021 | Moon et al. | |
| 2021/0132726 A1 | 5/2021 | Ryu | |
| 2021/0382524 A1 | 12/2021 | Kim et al. | |
| 2022/0244761 A1 | 8/2022 | Kim et al. | |
| 2023/0266799 A1* | 8/2023 | Kim | G06F 1/1637 |
| | | | 345/156 |

FOREIGN PATENT DOCUMENTS

| | | |
|---|---|---|
| KR | 20-0339119 Y1 | 1/2004 |
| KR | 10-2005-0102399 A | 10/2005 |
| KR | 10-1291748 B1 | 7/2013 |
| KR | 10-1306755 B1 | 9/2013 |
| KR | 10-2018-0005779 A | 1/2018 |
| KR | 10-2019-0137433 A | 12/2019 |
| KR | 10-2020-0127741 A | 11/2020 |
| KR | 10-2020-0127744 A | 11/2020 |
| KR | 10-2020-0137902 A | 12/2020 |
| KR | 10-2021-0047753 A | 4/2021 |
| KR | 10-2021-0052422 A | 5/2021 |

OTHER PUBLICATIONS

Extended European Search Report dated Oct. 14, 2024; European Appln. No. 22870137.1-1218 / 4366281 PCT/KR2022011305.

* cited by examiner

ELECTRONIC DEVICE COMPRISING PROTECTION MEMBER FOR PROTECTING DISPLAY

CROSS-REFERENCE TO RELATED APPLICATION(S)

This application is a continuation application, claiming priority under § 365(c), of an International application No. PCT/KR2022/011305, filed on Aug. 1, 2022, which is based on and claims the benefit of a Korean patent application number 10-2021-0123538, filed on Sep. 15, 2021, in the Korean Intellectual Property Office, the disclosure of which is incorporated by reference herein in its entirety.

TECHNICAL FIELD

An embodiment relates to an electronic device including a protective member for a display.

BACKGROUND ART

As interest in large-screen portable electronic devices increases, demand for a foldable device is increasing. In the case of a foldable device, a folded state and an unfolded state of the device may be provided. An electronic device may be used by changing the electronic device to an unfolded state when a productivity activity on a large screen is required, and the electronic device may be changed to a folded state in order to reduce a size of the electronic device when portability is required, such as when moving or exercising.

DISCLOSURE

Technical Problem

An electronic device that adopts a foldable device configuration may comprise a flexible display. In a folded state of the electronic device, at least a part of the flexible display may contact another part, because it can be folded with respect to a folding axis. Also, in the folded state of the electronic device, when the flexible display parts come in contact with each other, the display may be damaged by being shocked. A method is required to prevent damage to the flexible display panel by reducing the shock that occurs when the electronic device switches to the folded or unfolded state.

The technical problems to be solved in this document are not limited to those described above, and other technical problems not mentioned herein will be clearly understood by those having ordinary knowledge in the art to which the present disclosure belongs, from the following description.

Technical Solution

According to an embodiment, an electronic device may include a first housing including a first surface and a second surface facing the first surface and spaced apart from the first surface, a second housing including a third surface and a fourth surface facing the third surface and spaced apart from the third surface, a hinge structure pivotably connecting the first housing and the second housing, a display disposed on the first surface and the third surface, a protective member including a recess including a through hole and disposed along at least part of edges of the display, a damper supported in the recess, a rod including an end portion protruded from the damper through the through hole, and a fastener disposed on a surface of the protective member facing to an inner surface formed by the first surface, the second surface, and a side surface of the first housing, combined with the end portion of the rod, expanded from the end portion in a radial direction, and covering at least part of the through hole.

According to an embodiment, an electronic device may include a first housing including a first surface and a second surface facing the first surface and spaced apart from the first surface, a second housing including a third surface and a fourth surface facing the third surface and spaced apart from the third surface, a hinge structure pivotably connecting the first housing and the second housing, a display disposed on the first surface and the third surface, a protective member including a recess including a through hole and disposed along at least part of edges of the display, a damper supported in the recess, a rod including an end portion protruded from the damper through the through hole, and a washer including an opening filled with the rod by coupling with the rod and disposed on a surface of the protective member facing an inner space formed by the first surface, the second surface and a side surface of the first housing.

According to an embodiment, an electronic device may include a first housing including a first surface in which a display is disposed, a second surface facing the first surface, and a side surface disposed between the first surface and the second surface, a protective member including a recess including a through hole and disposed along at least part of edges of the display, a shock absorbing member supported by the recess, and, a washer disposed on a surface of the protective member facing the recess and including an opening aligned with the through hole, and the shock absorbing member may include a damper in contact with the recess, a rod portion extending from the damper through the through hole and the opening, and a hook portion that extends from an end portion of the rod portion spaced apart from the damper in a radial direction of the opening, contacts the washer, and covers the opening.

Advantageous Effects

According to an embodiment, when an electronic device is changed to a folded state, the electronic device including a protective member for a display can prevent a flexible display panel from directly contacting itself, and reduce shock transmitted to the flexible display panel through the protective member disposed along an edge of the display and an elastic shock absorbing member forming a part of the protective member.

According to an embodiment, the electronic device including the protective member for the display can prevent direct contact of the display panel and reduce the shock transmitted to the flexible display panel, thereby reducing damage to the display panel.

According to an embodiment, a coupling force of a shock absorbing member fastened to the protective member for the display may be enhanced.

The effects that can be obtained from the present disclosure are not limited to those described above, and any other effects not mentioned herein will be clearly understood by those having ordinary knowledge in the art to which the present disclosure belongs, from the following description.

MODE FOR INVENTION

Figure 1:
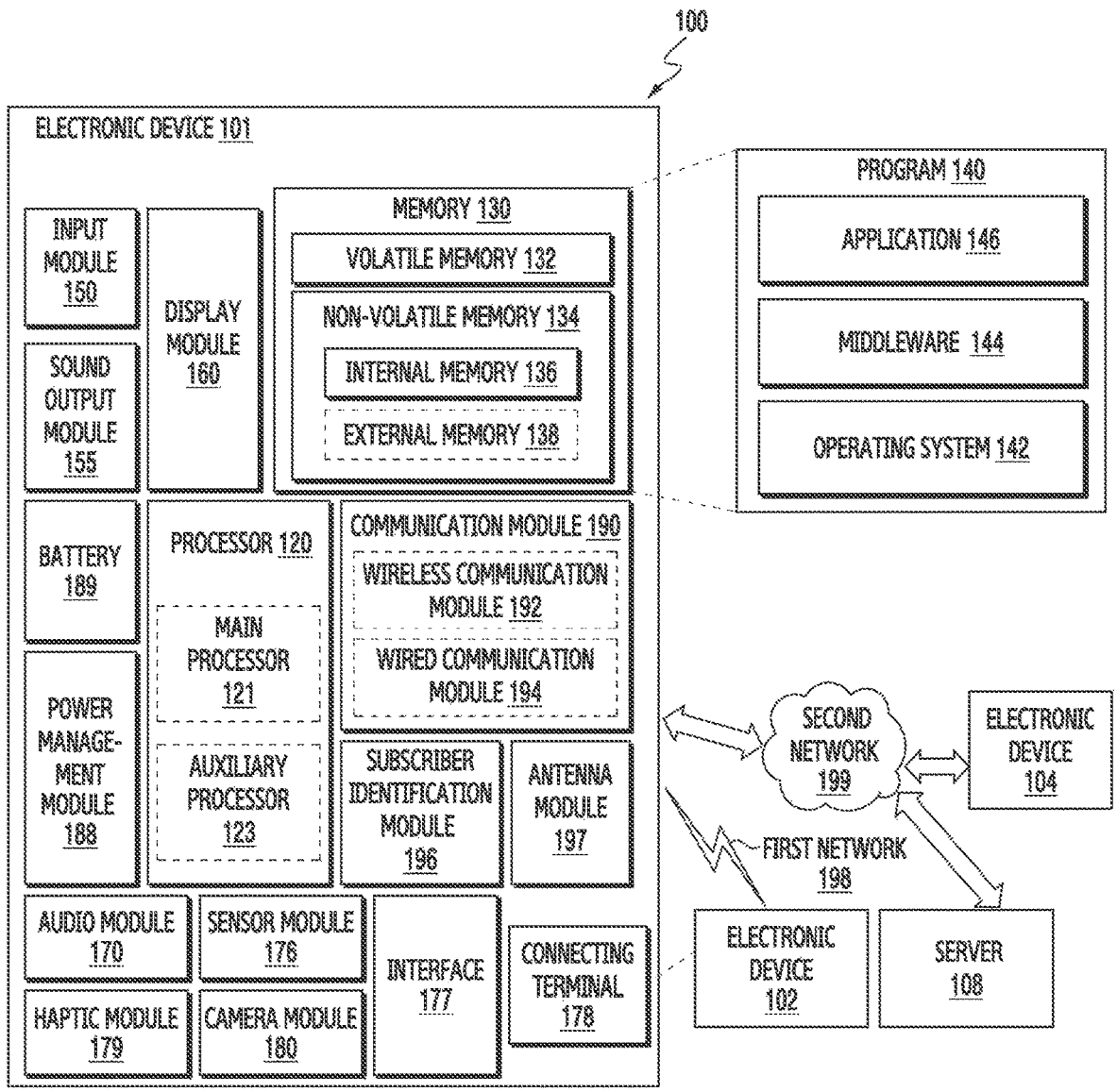
FIG. 1 is a block diagram of an electronic device in a network environment, according to an embodiment.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
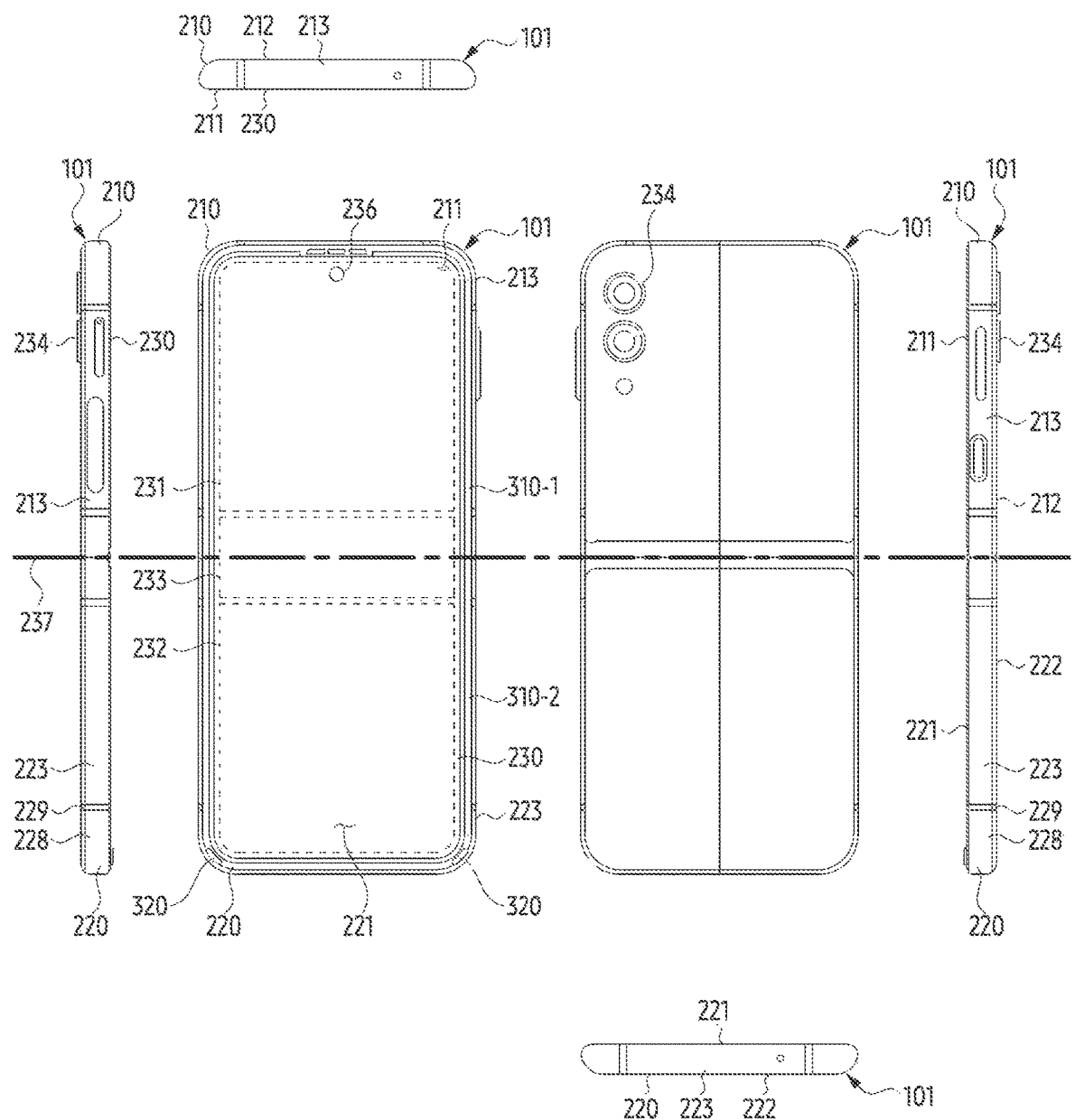
FIG. 2A illustrates an example of an unfolded state of an electronic device, according to an embodiment.
Figure 2B:
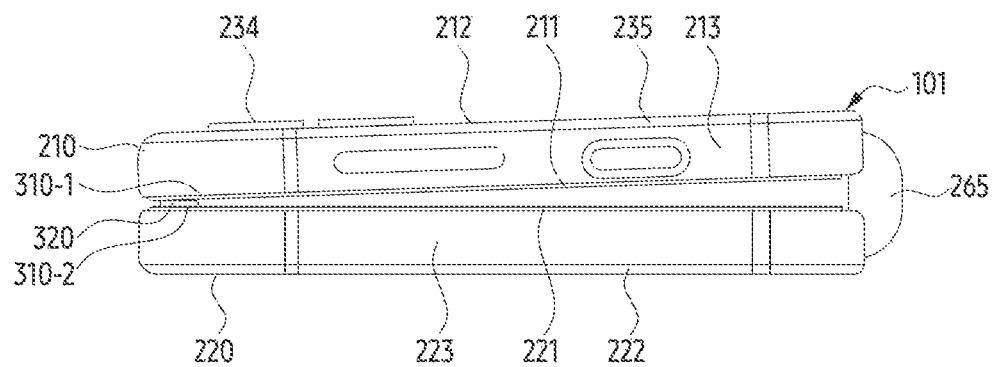
FIG. 2B illustrates an example of a folded state of an electronic device according to an embodiment.
Figure 2C:
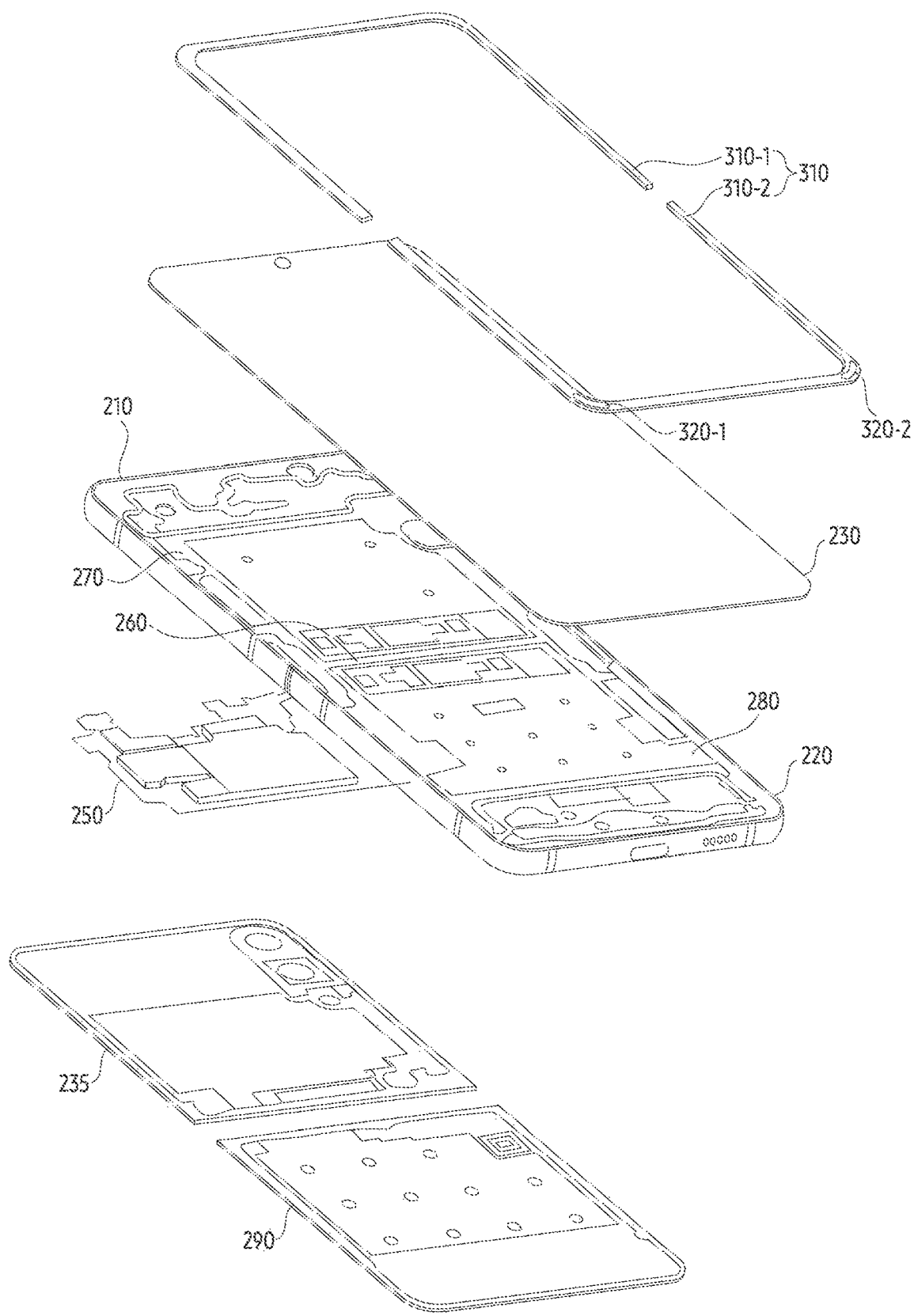
FIG. 2C is an exploded view of an electronic device according to an embodiment.

FIG. 2A illustrates an example of an unfolded state of an electronic device, according to an embodiment, FIG. 2B illustrates an example of a folded state of an electronic device according to an embodiment, and FIG. 2C is an exploded view of an electronic device according to an embodiment.

Referring to FIGS. 2A, 2B, and 2C, an electronic device 101 may include a first housing 210, a second housing 220, and a flexible display panel 230.

According to an embodiment, the first housing 210 may include a first surface 211, a second surface 212 facing away the first surface 211, and a first side surface 213 surrounding at least a part of the first surface 211 and the second surface 212. In an embodiment, the second surface 212 may further include at least one camera 234 and a display panel 235 exposed through a portion of the second surface 212. In an embodiment, the first housing 210 may include a first protective member 310-1 disposed along an edge of the first surface 211. In an embodiment, the first housing 210 may provide a space formed by the first surface 211, the second surface 212, and the side surface 213 as a space for arranging components of the electronic device 101. In an embodiment, a first side surface 213 and a second side surface 223 may include a conductive material, a non-conductive material, or a combination thereof. For example, the second side surface 223 may include a conductive member 228 and a non-conductive member 229. The conductive member 228 may include a plurality of conductive members, and the plurality of conductive members may be spaced apart from each other. The non-conductive member 229 may be disposed between a plurality of conductive members. An antenna structure may be formed by some or a combination of the plurality of conductive members and the plurality of non-conductive members.

In an embodiment, the second housing 220 may include a third surface 221, a fourth surface 222 facing away the third surface 221, and a second side surface 223 surrounding at least a part of the third surface 221 and the fourth surface 222. In an embodiment, the fourth surface 222 may further include a rear plate 290 disposed on the fourth surface 222. According to an embodiment, each of the first housing 210 and the second housing 220 may include a first protective member 310-1 and a second protective member 310-2. The first protective member 310-1 and the second protective member 310-2 may be disposed on the first surface 211 and the third surface 221 along an edge of the flexible display panel 230. The first protective member 310-1 and the second protective member 310-2 may reduce the inflow of a foreign substance (e.g., dust or moisture) through a gap between the flexible display panel 230 and the first housing 210 and the second housing 220. The first protective member 310-1 may be disposed along an edge of a first display region 231, and the second protective member 310-2 may be disposed along an edge of a second display region 232. The first protective member 310-1 may be formed by being attached to the first side surface 213 of the first housing 210 or integrally formed with the first side surface 213. The second protective member 310-2 may be formed by being attached to the second side surface 223 of the second housing 220 or integrally formed with the second side surface 223.

In an embodiment, the second side surface 223 may be pivotably (or rotatably) connected to the first side surface 213 through a hinge structure 260 disposed on a hinge cover 265. The hinge structure 260 may include a hinge module and a hinge plate. The hinge plate may include a first hinge plate and a second hinge plate, the first hinge plate may be connected to the first housing 210, and the second hinge plate may be connected to the second housing 220. In an embodiment, the second housing 220 may provide a space formed by the third surface 221, the fourth surface 222 facing away the third surface 221, and the side surface 223 surrounding at least a part of the third surface 221 and the fourth surface 222 as a space for arranging components of the electronic device 101. In an embodiment, the flexible display panel 230 may include a window exposed to the outside. The window may protect a surface of the flexible display panel 230, and may be formed of a transparent member to transmit visual information provided from the flexible display panel 230 to the outside. The window may include a glass material such as ultra-thin glass (UTG) or a polymer material such as polyimide (PI). In an embodiment, the flexible display panel 230 may be disposed on the first surface 211 of the first housing 210 and the third surface 221 of the second housing 220 across the hinge cover 265. The flexible display panel 230 may include the first display region 231 disposed on the first surface 211 of the first housing, the second display region 232 disposed on the third surface 221 of the second housing, and a third display region 233 between the first display region 231 and the second display region 232. The first display region 231, the second display region 232, and the third display region 233 may form a front surface of the flexible display panel 230.

In an embodiment, an opening may be formed in a part of a screen display region of the flexible display panel 230, or a recess or opening may be formed in a support member (e.g., a bracket) supporting the flexible display panel 230. The electronic device 101 may include at least one camera aligned with the recess or the opening. For example, the first display region 231 may further include at least one camera 236 capable of obtaining an image from the outside through a part of the first display region 231. According to an embodiment, the at least one camera 236 may be included on a rear surface of the flexible display panel 230 corresponding to the first display region 231 or the second display region 232 of the flexible display panel 230. For example, the at least one camera 236 may be disposed under the flexible display panel 230 and surrounded by the flexible display panel 230. The at least one camera 236 may not be exposed to the outside by being surrounded by the flexible display panel 230. However, it is not limited thereto, and the flexible display panel 230 may include an opening exposing the at least one camera 236 to the outside. Although not illustrated in FIGS. 2A and 2B, in an embodiment, the flexible display panel 230 may further include a rear surface opposite to the front surface. In an embodiment, the flexible display panel 230 may be supported by a first support member 270 of the first housing 210 and a second support member 280 of the second housing 220.

In an embodiment, the hinge structure 260 may be configured to rotatably connect the first support member 270 forming the first housing 210 and fastened to the first hinge plate 266 and the second support member 280 forming the second housing 220 and fastened to the second hinge plate 267.

In an embodiment, while the electronic device 101 is in the folded state, the hinge cover 265 surrounding the hinge structure 260 may be partially exposed between the first housing 210 and the second housing 220. In another embodiment, while the electronic device 101 is in the unfolded state, the hinge cover 265 may be covered by the first housing 210 and the second housing 220.

In an embodiment, the electronic device 101 may be folded with respect to a folding axis 237 passing the hinge cover 265. For example, the hinge cover 265 may be disposed between the first housing 210 and the second housing 220 of the electronic device 101 in order to bend, curve, or fold the electronic device 101. For example, the first housing 210 may be connected to the second housing 220 through the hinge structure 260 disposed on the hinge cover 265, and may be rotated with respect to the folding axis 237.

In an embodiment, the electronic device 101 may be folded by rotating with respect to the folding axis 237 so that the first housing 210 and the second housing 220 face each other. In an embodiment, the electronic device 101 may be folded so that the first housing 210 and the second housing 220 may be stacked or overlapped each other.

The electronic device 101 may include the first housing 210, the second housing 220, the hinge structure 260, the flexible display panel 230, the printed circuit board 250, the display panel 235, the rear plate 290, and the protective member 310. According to an embodiment, the electronic device 101 may omit at least one of components or may additionally include another component. At least one of the components of the electronic device 300 may be the same or similar to at least one of the components of the electronic device 101 of FIG. 1, 2A, or 2B, and redundant descriptions will be omitted below.

The hinge structure 260 may include a hinge module and a hinge plate. The hinge module may include a hinge gear that makes the first housing 210 and the second housing 220 pivotable.

The first housing 210 may include the first support member 270 and the second support member 280. The first support member 270 may be partially surrounded by the first side surface 213, and the second support member 280 may be partially surrounded by the second side surface 223. The first support member 270 may be integrally formed with the first side surface 213, and the second support member 280 may be integrally formed with the second side surface 223. According to an embodiment, the first support member 270 may be formed separately from the first side surface 213, and the second support member 280 may be formed separately from the second side surface 223. The first side surface 213 and the second side surface 223 may be formed of a metallic material, a non-metallic material, or a combination thereof, and may be used as an antenna.

A surface of the first support member 270 may be combined with the flexible display panel 230, and another surface of the first support member 270 may be combined with the display panel 235. A surface of the second support member 280 may be combined with the flexible display panel 230, and another surface of the second support member 280 may be combined with the rear plate 290.

The printed circuit board 250 and a battery may be disposed between a surface formed by the first support member 270 and the second support member 280 and a surface formed by the display panel 235 and the rear plate 290. The printed circuit board 250 may be separated to be disposed on each of the first support member 270 of the first housing 210 and the second support member 280 of the second housing 220. Components for implementing various functions of the electronic device 101 may be disposed on the printed circuit board 250.

The protective member 310 may be disposed along an edge of the flexible display panel 230. As the electronic device 101 is changed to the folded state, the protective member 310 may reduce damage caused by contact between the first display region 231 and the second display region 232 of the flexible display panel 230. The protective member 310 may include the first protective member 310-1 and the second protective member 310-2. The first protective member 310-1 may be disposed on the first housing 210, and the second protective member 310-2 may be disposed on the second housing 220. A shock absorbing member 320 may be disposed on the protective member 310. The shock absorbing member 320 may be disposed in either the first protective member 310-1 or the second protective member 310-2, or may be disposed in the first protective member 310-1 and the second protective member 310-2. The shock absorbing member 320 may be disposed on the second protective member 310-2.

Figure 3:
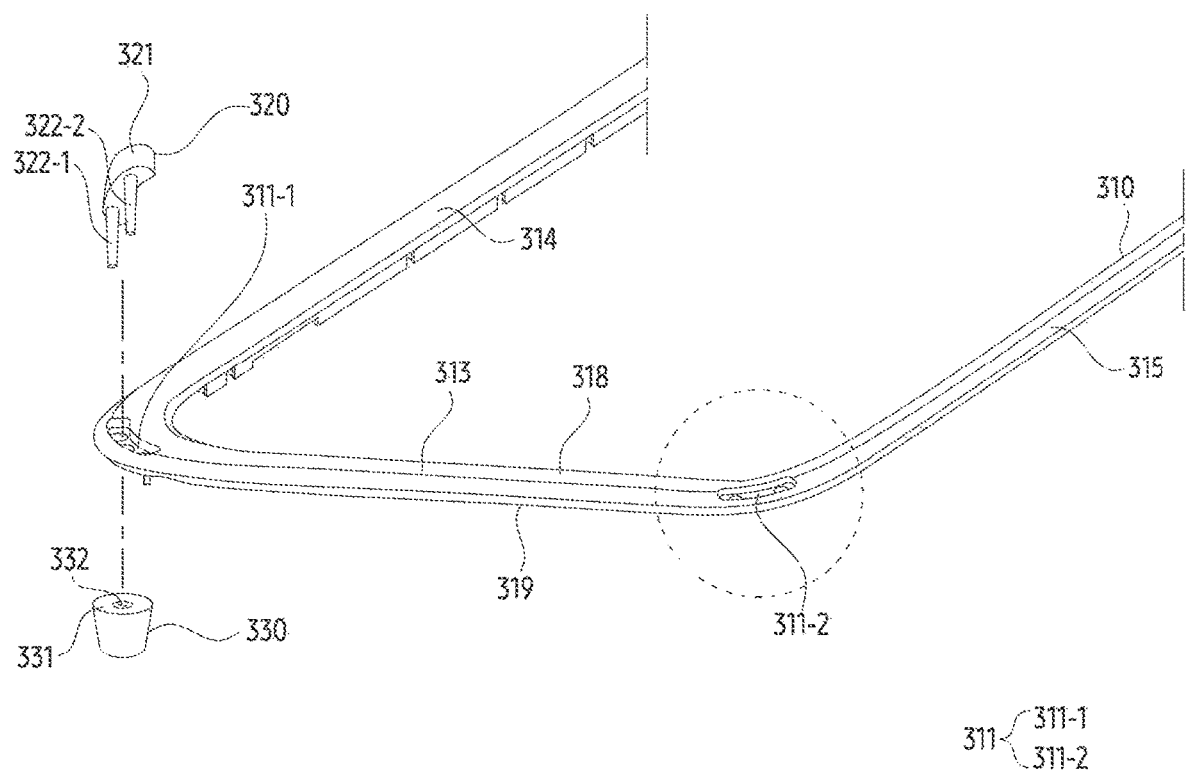
FIG. 3 illustrates a combination relationship between a damper, a protective member, and a fastener, according to an embodiment.

FIG. 3 illustrates a combination relationship between a damper, a protective member, and a fastener, according to an embodiment.

Referring to FIG. 3, an electronic device 101 (e.g., the electronic device 101 of FIG. 1) may include a protective member 310 (e.g., the protective member 310 of FIG. 2C), a shock absorbing member 320, and a fastener 330 to protect a display panel (e.g., the flexible display panel 230 of FIG. 2A).

According to an embodiment, the protective member 310 may be disposed along at least a part of edges of the display panel. The protective member 310 may be one of the first protective member 310-1 (e.g., the first protective member 310-1 of FIG. 2C) disposed in a first housing 210 (e.g., the first protective member 310-1 of FIG. 2C) and the second protective member 310-2 (e.g., the second protective member 310-2 of FIG. 2C) disposed in the second housing 220. The protective member 310 may include a surface 318 facing a direction toward which a display faces outside and another surface 319 facing the surface 318, contacting a part of the display, and contacting a part of a side surface of the housing.

the protective member 310 may include a first edge 313 parallel to a folding axis 237, a second edge 314-1 extending from an end of the first edge 313 to the folding axis 237, and a third edge 314-2 extending from another end of the first edge 313 to the folding axis 237.

According to an embodiment, the protective member 310 may include a recess 311. The recess 311 may be grooves occupied by a shock absorbing member 320. The recess 311 may be a groove recessed from the surface 318 of the protective member 310 toward the other surface 319. The recess 311 may include a first recess 311-1 and a second recess 311-2. The first recess 311-1 may be symmetrical to the second recess 311-2 based on an imaginary line a that is perpendicular to the first edge 313 and has the same distance from the second edge 314-1 and the same distance from the third edge 314-2. According to an embodiment, the first recess 311-1 may be disposed at a corner region where the first edge 313 and the second edge 314-1 meet, and the second recess 311-2 may be disposed at a corner region where the first edge 313 and the third edge 314-2 meet.

For example, a distance between the first recess 311-1 and the second edge 314-1 may be equal to a distance between the second recess 311-2 and the third edge 314-2. The first recess 311-1 and the second recess 311-2 may be disposed at the first edge 313. For another example, the first recess 311-1 may be disposed at the second edge 314-1, and the second recess 311-2 may be disposed at the third edge 314-2. The distance from the first edge 313 to the first recess 311-1 and the second recess 311-2 may be the same.

The shock absorbing member 320 may be inserted into the recess 311 of the protective member 310. When the electronic device 101 is changed to the folded state, the shock absorbing member 320 fixed to the recess 311 may be in contact with a protective member distinct from the protective member 310 in which the shock absorbing member 320 is not disposed. For example, the shock absorbing member 320 and the recess 311 may be disposed in the second protective member 310-2 and may not be disposed in the first protective member 310-1. The first protective member 310-1 may be in contact with the second protective member 310-2 when the electronic device 101 is in the folded state. The first protective member 310-1 may prevent an exposed surface of the flexible display panel 230 from being directly contacted, by contacting the second protective member 310-2. Even when the first protective member 310-1 and the second protective member 310-2 exist, in case that the electronic device 101 is changed to the folded state and at least a part of the first protective member 310-1 and the second protective member 310-2 meet, shock may be transmitted to the flexible display panel 230. In order to reduce the shock transmitted to the flexible display panel 230, the electronic device 101 may include one of the first protective member 310-1 and the second protective member 310-2 or the shock absorbing member 320 disposed on the first protective member 310-1 and the second protective member 310-2.

According to an embodiment, the shock absorbing member 320 may include a damper 321 and at least one rod 322 extending from the damper 321 in a direction. The damper 321 may be formed of a material having elasticity to mitigate a shock transmitted to the flexible display panel 230. The rod 322 may be inserted through an opening formed in the recess 311. The damper 321 may include polycarbonate (PC), and the rod 322 may include thermoplastic polyurethane (TPU).

According to an embodiment, the fastener 330 may be combined with the rod 322 inserted into and passing through the opening. The fastener 330 may seat the shock absorbing member 320 in the recess 311 of the protective member 310, by combining with the rod 322 of the shock absorbing member 320. The fastener 330 may include a body 331 surrounding the opening 332. The opening 332 may be a passage through which the rod 322 passes. The fastener 330 may be referred to as a washer into which the rod 322 may be inserted.

According to the above-described embodiment, the protective member 310 may protect the display by combining the shock absorbing member 320 via the fastener 330. For example, when the electronic device is changed to the folded state, the protective member 310 may prevent the first region and the second region of the foldable display from directly contacting each other. The fastener 330 is fixed to the shock absorbing member 320 to distribute the shock to the damper 321 when the electronic device is changed to the folded state, thereby reducing the shock transmitted to the foldable display panel.

Figure 4:
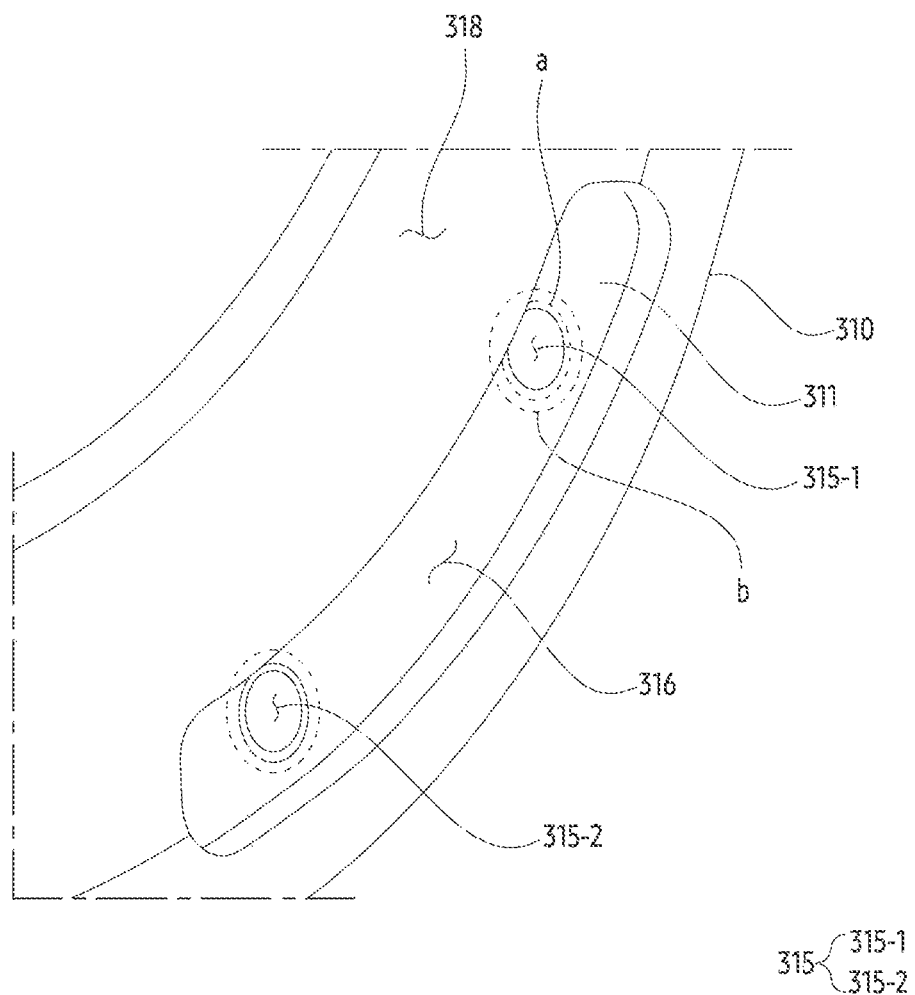
FIG. 4 illustrates a surface of a protective member, according to an embodiment.
Figure 5:
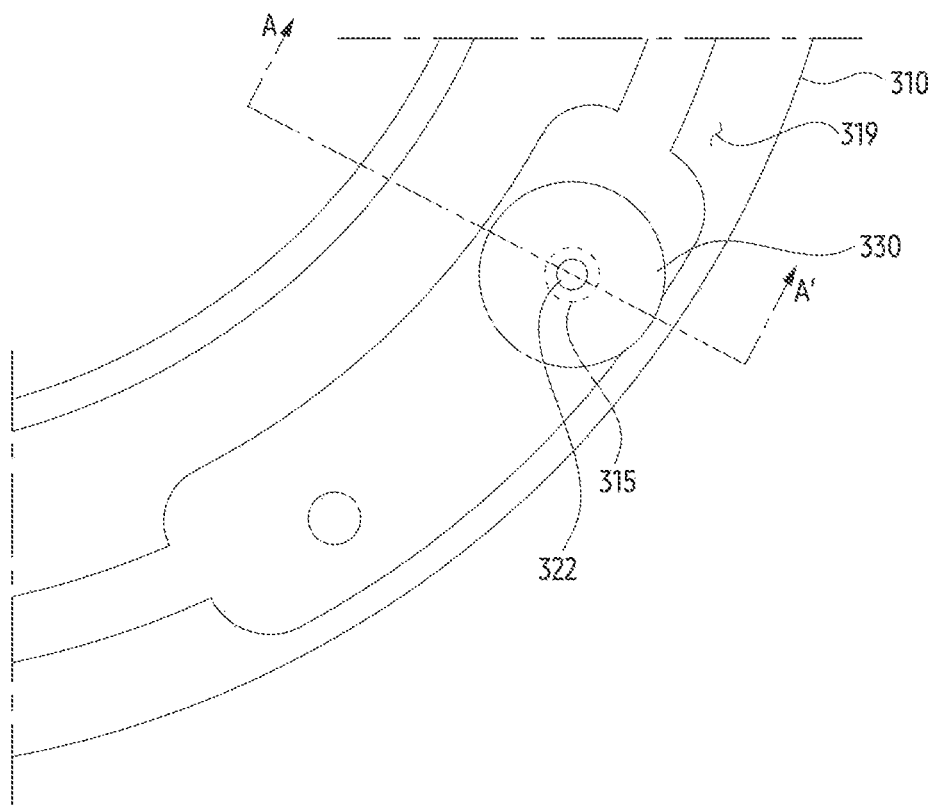
FIG. 5 illustrates another surface of a protective member fastened with a damper, according to an embodiment.

FIG. 4 illustrates a surface of a protective member, according to an embodiment, and FIG. 5 illustrates another surface of a protective member fastened with a damper, according to an embodiment.

Referring to FIG. 4, a protective member 310 may include a recess 311 formed on a surface 318 of the protective member 310. The recess 311 may be recessed from the surface 318 toward another surface facing the surface 318. The recess 311 may have a recessed surface 316 lower than the surface 318 of the protective member 310. The recess 311 may have at least one through hole 315. The through hole 315 may penetrate from the recessed surface 316 of the recess 311 to the other surface of the protective member 310.

A rod 322 may pass through the through hole 315. The through hole 315 may be penetrated to correspond to a form and shape of the rod 322. A shock absorbing member (e.g., the shock absorbing member 320 of FIG. 3) may include a rod extending in a direction without a hook structure or a fastening structure for fixing in an end portion of the rod 322. The maximum diameter of the through hole 315 may be determined in consideration of the maximum diameter of the rod 322. For example, the through hole 315 may match the maximum diameter of the rod, or the through hole 315 may have a diameter corresponding to a diameter of the rod 322 protruded by extending to the other surface facing the surface 318 of the protective member 310. The rod 322 may be guided by the through hole 315 so as to pass and protrude from the surface 318 of the protective member 310 to the other surface. The through hole 315 may have a minimum diameter through which the rod 322 may pass.

When the rod 322 is manufactured by combining with the fastener 330, a diameter of the through hole 315 may be formed in a diameter capable of being passed by the fastener 330. In order for a load combined with the fastener to pass through the through hole, the through hole needs to have an opening corresponding to the size and shape of the fastener 330. Since the size of the fastener 330 is larger than a cross-sectional area of the rod 322, the size of the through hole 315 may be larger. As the size of the through hole 315 increases, a contact area between the recessed surface 316 of the recess 311 and the damper 321 may decrease. As the contact area decreases, an adhesive area of an adhesive member may decrease.

For example, the recess 311 should have a through hole corresponding to a region a for passage of a hook and a fastener when the hook or the fastener for combining is attached to an end of the rod 322, but the through hole 315 may have a cross-sectional area corresponding to a region b for passage of the rod 322 when the rod 322 extends in a direction.

According to an embodiment, a region excluding through holes 315-1 and 315-2 formed on the recessed surface 316 of the recess 311 may be an application region of an adhesive member. The recessed surface 316 forming through holes 315-1 and 315-2 to correspond to the region a may have a larger application area for the adhesive member than the recessed surface 316 forming through holes to correspond to the region b. The recess 311 having a large application area for the adhesive member may enhance fixing force with the damper 321 seated in the recess 311. For example, the adhesive member may be disposed between the recessed surface 316 of the recess 311 and the damper 321. The adhesive member may be disposed between the recess 311 and the recessed surface 316 to attach the shock absorbing member 320 to the protective member 310.

Referring to FIG. 5, the rod 322 of the shock absorbing member 320 may protrude to the other surface 319 of the protective member 310. An end of the rod 322 may be attached to the damper 321, and another end of the rod 322 may protrude through the through hole 315. The protruding end of the rod 322 may be combined with the fastener 330. The fastener 330 may extend from the protruding end of the rod 322 in a radial direction of the through hole 315 to cover the through hole. The fastener 330 may extend in all directions from an edge of the through hole 315. The fastener 330 may fully cover the through hole, and a portion of the fastener 330 contacting the other surface 319 of the protective member 310 may function as a hook. The fastener 330 may be combined with the protrusion of the rod 322 protruding from the other surface 319 of the protective member 310 via fusion.

According to the above-described embodiment, after the rod 322 is inserted into the through hole, the electronic device 101 may provide a structure that prevents separation of the shock absorbing member 320 from the protective member 310 by coupling between the rod 322 and the fastener 330. For example, a hook integrally combined with an end of the rod 322 extended from the damper 321 may only cover a partial region around the through hole in order to pass the through hole 315. The fastener 330 may prevent the rod 322 combined with the damper 321 from separating from the protective member 310, by combining with the rod 322 passing through the through hole and covering the through hole.

Figure 6A:
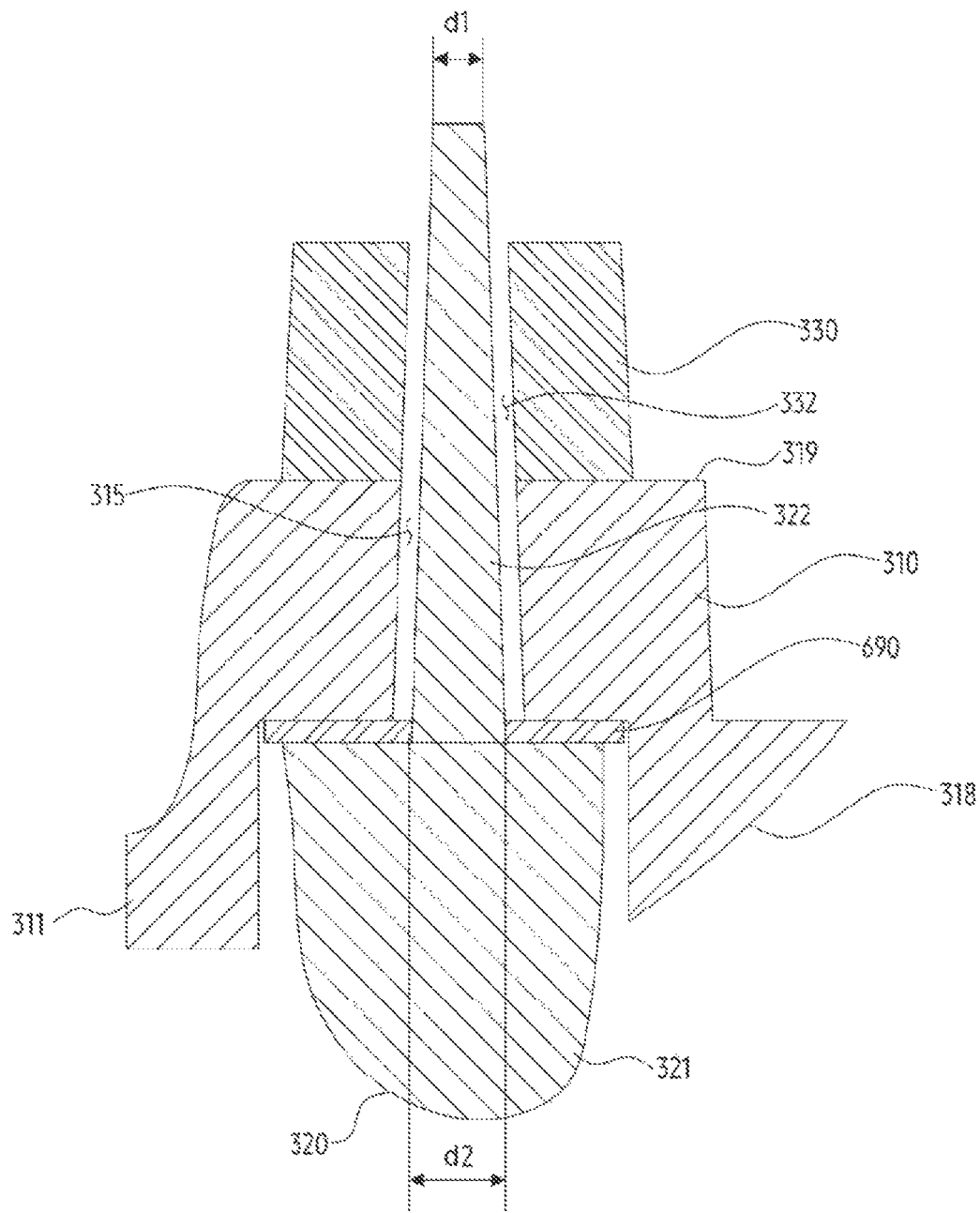
FIG. 6A is a cross-sectional view illustrating a state before a rod and a fastener are fused, according to an embodiment.
Figure 6B:
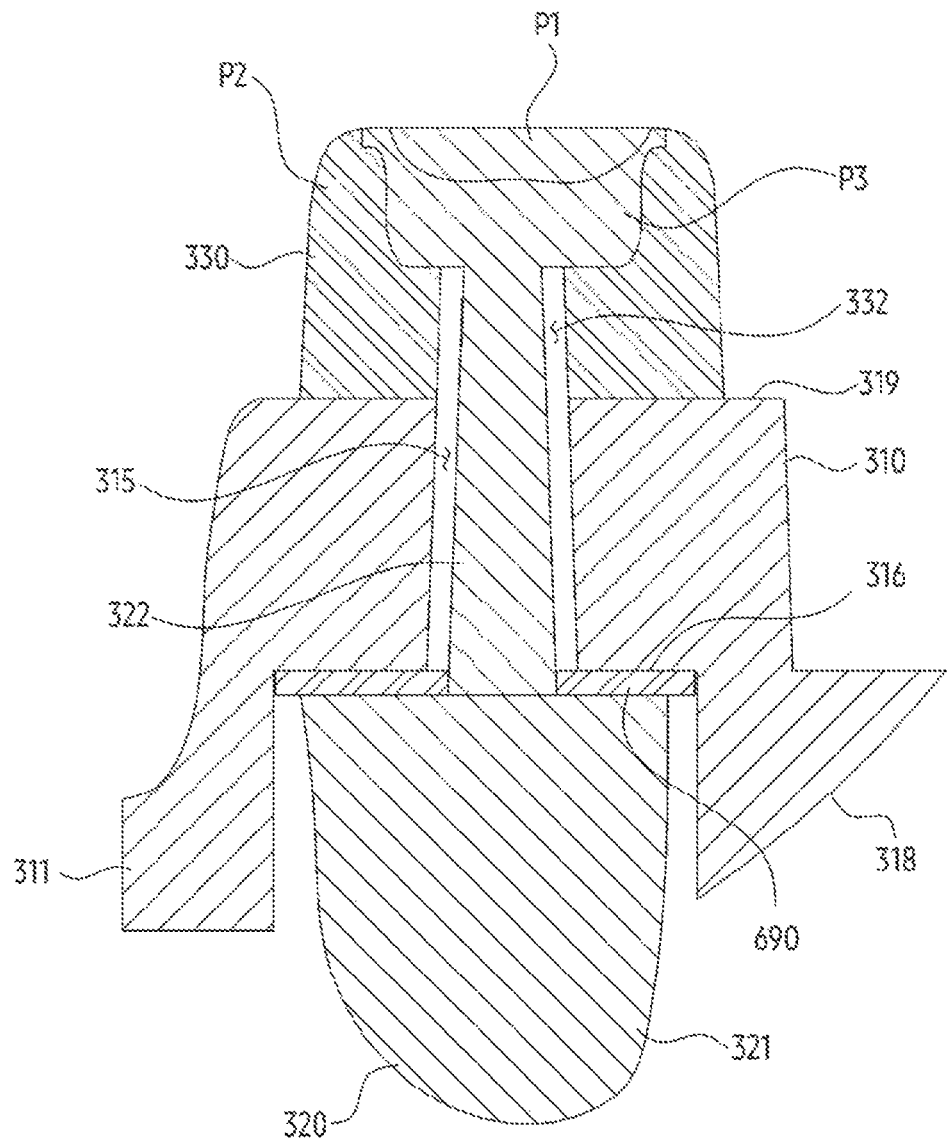
FIG. 6B is a cross-sectional view cut along a line A-A' of FIG. 5, according to an embodiment.

FIG. 6A is a cross-sectional view illustrating a state before a rod and a fastener are fused, according to an embodiment, and FIG. 6B is a cross-sectional view cut along a line A-A' of FIG. 5, according to an embodiment.

Referring to FIGS. 6A and 6B, an electronic device 101 (e.g., the electronic device 101 of FIG. 1) may include a protective member 310, a shock absorbing member 320, and a fastener 330. Before fusion as shown in FIG. 6A, a damper 321 of the shock absorbing member 320 may be seated in a recess 311 of the protective member 310. A surface of the damper 321 in which a rod 322 extends may contact a recessed surface 316 of the recess 311. When the damper 321 is seated in the recess 311, the rod 322 may protrude with respect to a surface 318 of the protective member 310. When the damper 321 is seated in the recess, the rod 322 of the damper 321 may protrude to the outside of the fastener 330 through an opening 332 of the fastener 330. An adhesive member 690 may be disposed between the damper 321 and the protective member 310. The adhesive member 690 may attach the protective member 310 and the damper 321.

According to an embodiment, the rod 322 may pass through the through hole 315 formed in the protective member 310 and protrude from another surface 319 of the protective member 310. A cross-sectional area of an end of the through hole 315 contacting the recess 311 may be wider than a cross-sectional area of another end of the through hole 315 contacting the other surface 319 of the protective member 310. The rod 322 inserted into the through hole 315 may have a shape corresponding to a shape of the through hole 315. For example, a cross-sectional area of an end of the rod 322 in contact with the damper 321 may be wider than a cross-sectional area of another end of the rod 322 contacting the fastener 330. When a cross section of the rod 322 is circular, a diameter (d1) of the end of the rod 322 contacting the damper 321 may be longer than a diameter (d2) of the other end of the rod 322 contacting the fastener 330.

According to an embodiment, the fastener 330 may be in contact with another surface of the protective member 310 facing an inner space of the housing (e.g., the other surface 319 of the protective member 310 faces). The fastener 330 may include an opening 332, and an end portion of the rod 322 may be surrounded via the opening 332.

Referring to FIG. 6B, the fastener 330 in contact with the other surface 319 of the protective member 310 may be fused to the rod 322. The fastener 330 may be fixed while surrounding the through hole 315 of the protective member 310, by the fusion. For example, protrusion of the rod 322 constituting the shock absorbing member 320 protruding from the fastener 330 may be melted together with the fastener 330 by heat. The shock absorbing member 320 may be fixed to the protective member 310 by the fusion.

According to an embodiment, a material of the fastener 330 may be different from a material of the rod 322. The fastener 330 may be mixed with different materials through fusion with the rod 322. For example, a material of the region P1 of the fastener 330 contacting an end of the rod 322 may be different from a material of the region P2 of the fastener 330 contacting a surface of the protective member 310. A region P3 between the region P1 and the region P2 may be a region in which the material of the region P1 and the material of the region P2 are mixed by fusion between the end of the rod 322 and the fastener 330. For example, the material of the region P1 contacting the end of the rod 322 among the fasteners 330 may be a material constituting the rod 322, or have the highest weight ratio of a material constituting the rod 322. The region P1 may be a region formed by melting a portion of an end of the rod 322 by fusion. The material of the region P2 contacting the surface of the protective member 310 among the fastener 330 may be a material of the protective member 310, or have the highest weight ratio of the material of the protective member 310. The region P2 may be a region having little influence on heat due to fusion, among the protective member 310. Among the fastener 330, the region P3 between the region P1 and the region P2 may be a region in which a material constituting the region P1 and a material constituting the region P2 are mixed. The region P3 of the fastener 330 may include a boundary melted and fused together with the rod 322 and the fastener 330.

According to an embodiment, a melting point of the fastener 330 may be lower than a melting point of the protective member 310. Since the melting point of the fastener 330 is lower than the melting point of the protective member 310, even when the fastener 330 melts during fusion, the protective member 310 may not melt.

According to an embodiment, a difference between the melting point of the fastener 330 and the melting point of the protective member 310 may be greater than a difference between the melting point of the fastener 330 and a melting point of the rod 322. For example, the melting point of the fastener 330 and the melting point of the rod 322 may be the same or similar. During the fusion process, the fastener 330 and the rod 322 may be melted and mixed with each other at a similar temperature.

According to the above-described embodiment, the damper 321 may be fixed to the protective member 310 by fusion of the rod 322 and the fastener 330 extended from the damper 321. The adhesive member 690 disposed between the damper 321 and the recess 311 of the protective member 310 may provide adhesion between the damper 321 and the protective member 310. The damper 321 seated in the recess 311 of the protective member 310 may be fixed to the protective member 310 by the fusion and the adhesion.

Figure 7:
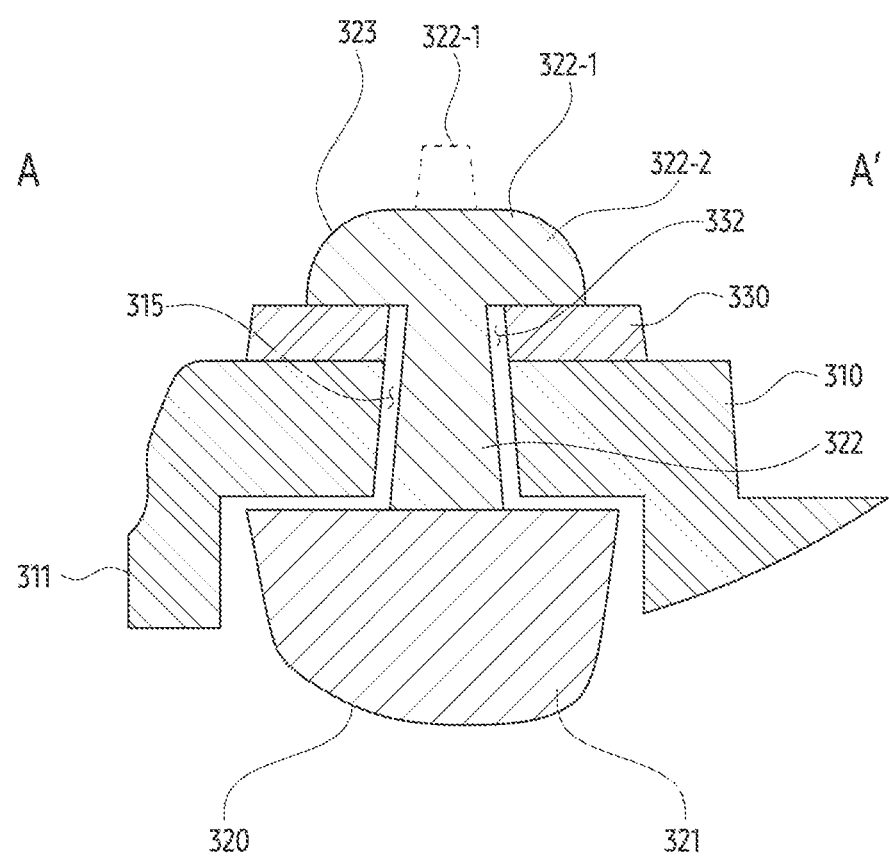
FIG. 7 illustrates another example of a combination relationship between a damper and a fastener, according to an embodiment.

FIG. 7 illustrates another example of a combination relationship between a damper and a fastener, according to an embodiment.

Referring to FIG. 7, an electronic device 101 (e.g., the electronic device 101 of FIG. 1) may include a protective member 310, a shock absorbing member 320, and a fastener 330. A damper 321 of the shock absorbing member 320 may be seated in a recess 311 by a rod 322 inserted along a through hole 315 penetrating the protective member 310 from a recess 311 of the protective member 310. The fastener 330 may include an opening 332. The rod 322 may penetrate the opening 332. An end portion of the rod 322 may protrude from the opening 332 by the penetration. The rod 322 may form a hook portion 323 formed by deformation of the end portion of the rod 322 protruding from the opening 332. The hook portion 323 may be formed by being deformed into the end portion 322-2 of the rod 322 after deformation by heat applied to the end portion 322-1 of the rod 322 before deformation. The melting point of the rod 322 may be lower than the melting point of the fastener 330. The rod 322, which is partially melted due to heat being applied to the end of the rod 322, may be fused to the fastener 330. The fastener 330 may be formed of a material having a high melting point and reduce damage to the protective member 310. For example, the fastener 330 may prevent fusion tip from directly contacting the protective member 310 during heat fusion, thereby reducing damage to the protective member 310.

The hook portion 323, which is the end 322-2 of the rod after deformation, may extend in a radial direction of the opening 332 of the fastener 330 and may be in contact with the fastener 330. The hook portion 323 may fully surround the opening 332, and may fix the shock absorbing member 320 including the damper 321 to the protective member 310.

Figure 8:
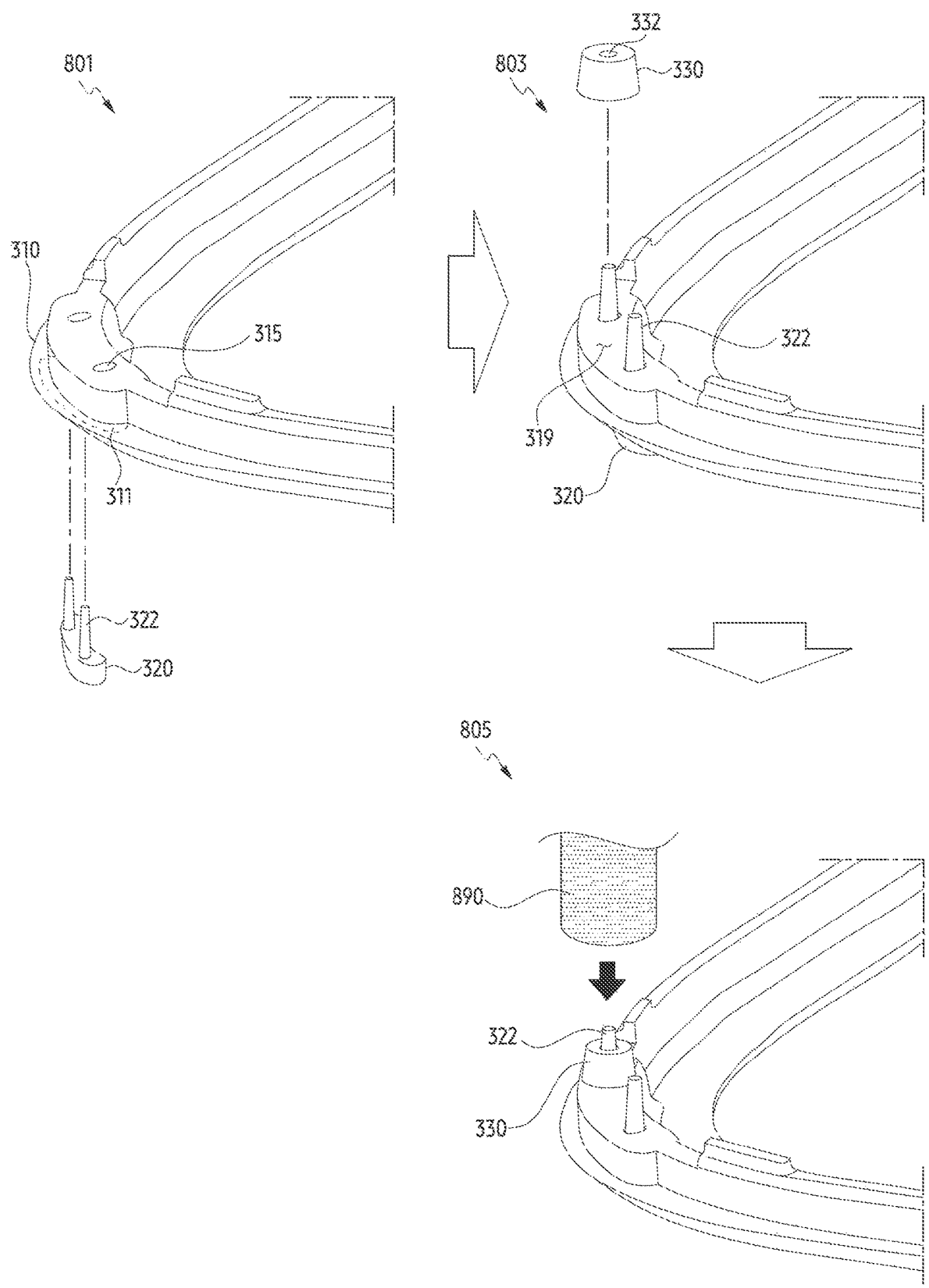
FIG. 8 illustrates a manufacturing process of a damper, a protective member, and a fastener, according to an embodiment.

FIG. 8 illustrates a manufacturing process of manufacturing a damper, a protective member, and a fastener, according to an embodiment.

Referring to FIG. 8, in process 801, a shock absorbing member 320 may be seated in a recess 311 formed in a protective member 310. For example, a load 322 of the shock absorbing member 320 may pass a through hole 315. A surface of the shock absorbing member 320 in contact with the rod 322 may be inserted into the recess 311 of the protective member 310. Before the shock absorbing member 320 is seated in the recess 311, adhesive member may be applied to a recessed surface (e.g., the recessed surface 316 of FIG. 4) of the recess 311. The adhesive member applied to the recessed surface 316 of the recess 311 may fix the shock absorbing member 320 to the recess 311.

In process 803, the fastener 330 may be disposed on another surface 319 of the protective member 310 through the penetration of the rod 322 of the shock absorbing member 320. For example, after the shock absorbing member 320 is seated in the recess 311, the opening 332 of the shock absorbing member 320 may be aligned with the rod 322 and disposed on the other surface 319 of the protective member 310. The shock absorbing member 320 may include a plurality of loads, and fasteners corresponding to the plurality of loads may be disposed on the other surface 319 of the protective member 310.

In step 805, the fastener 330 and the rod 322 may be combined with each other by a heat fusion device. The heat fusion device may bond different thermoplastic plastics by applying heat and pressure to surfaces of different thermoplastic plastics. The fastener 330 and the rod 322 may include thermoplastic. For example, the fastener 330 and the rod 322 may include thermoplastic polyurethane. The fastener 330 and the rod 322 may be melted and fused with each other by heat and pressure applied by a heat fusion tip of the heat fusion device. A combination of the fastener 330 and the rod 322 may form a hook portion that fully surrounds the through hole 315 of the protective member 310.

For another example, the fastener 330 may include a material having a melting point higher than thermoplastic, such as metal, and the rod 322 may include thermoplastic polyurethane. As the rod 322 is deformed by the heat and pressure applied to the rod 322, a hook portion formed to fully surround the opening 332 of the fastener 330 may be formed.

Figure 9:
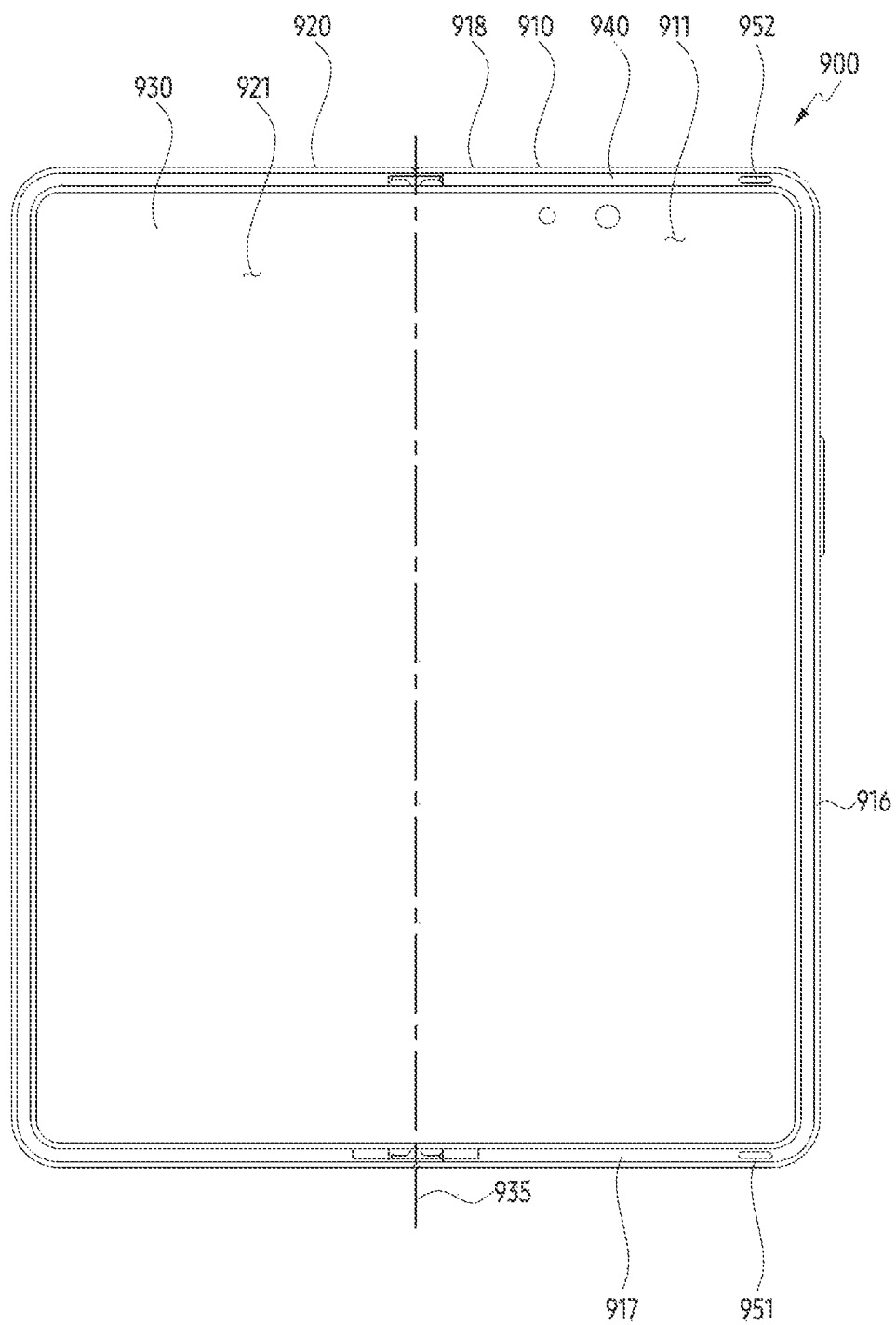
FIG. 9 illustrates an arrangement position of a damper, according to an embodiment.

FIG. 9 illustrates an arrangement position of a damper, according to an embodiment.

Referring to FIG. 9, an electronic device 900 may include a first housing 910, a second housing 920, and a hinge structure (e.g., the hinge structure 260 of FIG. 2C) that rotatably connects the first housing 910 and the second housing 920. The electronic device 900 may include a display 930 disposed on a first surface 911 of the first housing 910 and a second surface 921 of the second housing 920, a protective member 940 disposed along at least a part of edges of the display 930, and a plurality of shock absorbing members 951 and 952 disposed on the protective member 940, across the hinge structure. The shock absorbing members 951 and 952 may be fixed on the protective member 940 through the process described in FIG. 8.

The plurality of shock absorbing members 951 and 952 may be disposed in a protective member 940 disposed on the first housing 910. The plurality of shock absorbing members 951 and 952 may be disposed in one of the first housing 910 or the second housing 920. However, it is not limited thereto, and the plurality of shock absorbing members may be disposed in the first housing 910 and the second housing 920.

According to an embodiment, the plurality of shock absorbing members 951 and 952 may include a first shock absorbing member 951 and a second shock absorbing member 952.

The first housing 910 may include a first edge 916 parallel to a folding axis 935, a second edge 917 extending from an end of the first edge 916 toward the folding axis 935, a third edge 918 extending from another end of the first edge toward the folding axis 935. The first shock absorbing member 951 may be disposed at the second edge 917, and the second shock absorbing member 952 may be disposed at the third edge 918. Each of the first shock absorbing member 951 and the second shock absorbing member 952 may be spaced apart from the folding axis 935 by the same distance.

According to the above-described embodiment, an electronic device (e.g., the electronic device 101 of FIG. 1) may include a first housing (e.g., the first housing 210 of FIG. 2A) including a first surface (e.g., the first surface 211 of FIG. 2A) and a second surface (e.g., the second surface 212 of FIG. 2A) facing the first surface and spaced apart from the first surface, a second housing (e.g., the second housing 220 of FIG. 2A) including a third surface (e.g., the third surface 221 of FIG. 2A) and a fourth surface (e.g., the fourth surface 222 of FIG. 2A) facing the third surface and spaced apart from the third surface, a hinge structure (e.g., the hinge structure 260 of FIG. 2C) pivotably connecting the first housing and the second housing, a display (e.g., the flexible display panel 230 of FIG. 2A) disposed on the first surface and the third surface, a protective member (e.g., the protective member 310 of FIG. 2A) including a recess including a through hole and disposed along at least part of edges of the display, a damper (e.g., the damper 321 of FIG. 3) supported in the recess, a rod (e.g., the rod 322-1 or 322-2 of FIG. 3) including an end portion protruded from the damper through the through hole, and a fastener (e.g., the fastener 330 of FIG. 3) disposed on a surface of the protective member facing to an inner surface formed by the first surface, the second surface, and a side surface of the first housing, combined with the end portion of the rod, expanded from the end portion in a radial direction, and covering at least part of the through hole.

According to an embodiment, a material of a first portion (e.g., the region P1 in FIG. 6A) of the fastener in contact with the end portion of the rod may be different from a material of a second portion (e.g., the region P2 in FIG. 6A) of the fastener in contact with a surface of the protective member.

According to an embodiment, a third portion (e.g., the region P3 in FIG. 6A) between the first portion and the second portion may be a region in which material of the first region and material of the second region are mixed by coupling between the end portion of the rod and the fastener.

According to an embodiment, a melting point of the fastener may be lower than the protective member, and a difference between the melting point of the fastener and a melting point of the protective member may be greater than a difference between the melting point of the fastener and a melting point of the rod.

According to an embodiment, a cross-sectional area of an end of the through hole contacting the recess may be wider than a cross-sectional area of another end of the through hole contacting a surface of the protective member.

According to an embodiment, the rod may be inserted into the through hole from the end of the through hole in a direction toward the other end of the through hole.

According to an embodiment, the hinge structure may change a state of the electronic device to an unfolded state in which a first direction toward which the first surface faces and a second direction toward which the second surface faces are same or a folded state in which the first direction and the second direction are opposite, and the damper may protrude from the recess in the first direction and in contact with a part of the protection member in the folded state.

According to an embodiment, the rod may include polycarbonate (PC), and the damper may include thermoplastic polyurethane (TPU).

According to an embodiment, the electronic device may include adhesive member disposed between the recess and the damper.

According to an embodiment, the electronic device may include a second rod spaced apart from the rod, which is a first rod, and in contact with the damper, the recess may further include a second through hole (e.g., the through hole 315-2 of FIG. 4) through which the second rod penetrates in the recess, wherein the second through hole is spaced apart from the through hole, which is a first through hole (e.g., the through hole 315-1 of FIG. 4).

According to an embodiment, the electronic device may include a first housing (e.g., the first housing 210 of FIG. 2A) including a first surface (e.g., the first surface 211 of FIG. 2A) and a second surface (e.g., the second surface 212 of FIG. 2A) facing the first surface and spaced apart from the first surface, a second housing (e.g., the second housing 220 of FIG. 2A) including a third surface (e.g., the third surface 221 of FIG. 2A) and a fourth surface (e.g., the fourth surface 222 of FIG. 2A) facing the third surface and spaced apart from the third surface, a hinge structure (e.g., the hinge structure 260 of FIG. 2C) pivotably connecting the first housing and the second housing, a display (e.g., the flexible display panel 230 of FIG. 2A) disposed on the first surface and the third surface, a protective member (e.g., the protective member 310 of FIG. 3) including a recess (e.g., the recess 311 of FIG. 3) including a through hole and disposed along at least part of edges of the display, a damper (e.g., the damper 321 of FIG. 3) supported in the recess, a rod (e.g., the rod 322 of FIG. 3) including an end portion protruded from the damper through the through hole, and a washer (e.g., the fastener 330 of FIG. 3) including an opening filled with the rod by coupling with the rod and disposed on a surface of the protective member facing an inner space formed by the first surface, the second surface and a side surface of the first housing.

According to an embodiment, a material of a first portion (e.g., the region P1 in FIG. 6A) of the washer in contact with the end portion of the rod is different from a material of a second portion (e.g., the region P2 in FIG. 6A) of the washer in contact with a surface of the protective member, and a third portion (e.g., the region P3 in FIG. 6A) between the first portion and the second portion is a region in which material of the first region and material of the second region are mixed by coupling between the end of the rod and the washer.

According to an embodiment, a cross-sectional area of an end of the through hole contacting the recess may be wider than a cross-sectional area of another end of the through hole contacting a surface of the protective member, and the rod may be inserted into the through hole from the end of the through hole in a direction toward the other end of the through hole.

According to an embodiment, the rod may include polycarbonate (PC), and the damper may include thermoplastic polyurethane (TPU).

According to an embodiment, a melting point of the washer may be lower than the protective member, and a difference between the melting point of the washer and a melting point of the protective member may be greater than a difference between the melting point of the washer and a melting point of the rod.

According to an embodiment, an electronic device (e.g., the electronic device 101 of FIG. 1) may include a first housing (e.g., the first housing 210, the second housing 220, or a combination thereof of FIG. 2A) including a first surface (e.g., the first surface 211 of FIG. 2A) in which a display (e.g., the flexible display panel 230 of FIG. 2A) is disposed, a second surface (e.g., the second surface 212 of FIG. 2A) facing the first surface, and a side surface disposed between the first surface and the second surface, a protective member (e.g., the protective member 310 of FIG. 3) including a recess including a through hole and disposed along at least part of edges of the display, a shock absorbing member supported by the recess (e.g., the damper 321 of FIG. 3), and a washer (e.g., the fastener 330 of FIG. 3) disposed on a surface of the protective member facing the recess and including an opening (e.g., the opening 332 of FIG. 3) aligned with the through hole, and the shock absorbing member may include a damper in contact with the recess, a rod portion extending from the damper through the through hole and the opening, and a hook portion that extends from an end portion of the rod portion spaced apart from the damper in a radial direction of the opening, contacts the washer, and covers the opening.

According to an embodiment, a melting point of the washer may be higher than a melting point of the rod.

According to an embodiment, a cross-sectional area of an end of the through hole contacting the recess may be wider than a cross-sectional area of an end of the through hole contacting a surface of the protective member.

According to an embodiment, the rod portion may include polycarbonate, and the damper may include thermoplastic polyurethane.

According to an embodiment, the electronic device may include a second rod spaced apart from the rod in contact with the damper and spaced apart from the rod, which is a first rod, the recess may further include a second through hole through which the second rod penetrates, and spaced apart from the through hole, which is a first through hole, in the recess.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
   a first housing including a first surface and a second surface facing the first surface and spaced apart from the first surface;
   a second housing including a third surface and a fourth surface facing the third surface and spaced apart from the third surface;
   a hinge structure pivotably connecting the first housing and the second housing;
   a display disposed on the first surface and the third surface;
   a protective member including a recess including a through hole and disposed along at least part of an edge of the display;
   a damper supported in the recess;
   a rod protruded from the damper through the through hole; and
   a fastener disposed on a surface of the protective member facing to an inner surface formed by the first surface, the second surface, and a side surface of the first housing, the fastener combined with an end portion of the rod protruded from the through hole, extending from the end portion in a radial direction, and covering at least part of the through hole.

2. The electronic device of claim 1, wherein a material of a first portion of the fastener in contact with the end portion of the rod is different from a material of a second portion of the fastener in contact with a surface of the protective member.

3. The electronic device of claim 2, wherein a third portion between the first portion and the second portion is a region in which material of the first portion and material of the second portion are mixed by coupling between the end portion of the rod and the fastener.

4. The electronic device of claim 1,
   wherein a melting point of the fastener is lower than a melting point of the protective member, and
   wherein a difference between the melting point of the fastener and a melting point of the protective member is greater than a difference between the melting point of the fastener and a melting point of the rod.

5. The electronic device of claim 1, wherein a cross-sectional area of an end of the through hole contacting the recess is wider than a cross-sectional area of another end of the through hole contacting a surface of the protective member.

6. The electronic device of claim 5, wherein the rod is inserted into the through hole from the end of the through hole in a direction toward the another end of the through hole.

7. The electronic device of claim 1,
   wherein the hinge structure changes a state of the electronic device to an unfolded state in which a first direction toward which the first surface faces and a second direction toward which the second surface faces are same or a folded state in which the first direction and the second direction are opposite, and
   wherein the damper protrudes from the recess in the first direction and in contact with a part of the protection member in the folded state.

8. The electronic device of claim 1,
   wherein the rod includes polycarbonate (PC), and
   wherein the damper includes thermoplastic polyurethane (TPU).

9. The electronic device of claim 1, further comprising:
   an adhesive member disposed between the recess and the damper.

10. The electronic device of claim 1,
    wherein the rod is a first rod,
    wherein the electronic device further comprises:
       a second rod facing away from the first rod, and in contact with the damper,
    wherein the through hole is a first through hole, and
    wherein the recess further includes a second through hole through which the second rod penetrates and is spaced apart from the first through hole in the recess.

11. The electronic device of claim 1, wherein the fastener includes a washer including an opening filled with the rod according to conjunction with the rod and disposed on a surface of the protective member facing an inner space formed by the first surface, the second surface and a side surface of the first housing.

12. The electronic device of claim 11,
    wherein a material of a first portion of the washer in contact with the end portion of the rod is different from a material of a second portion of the washer in contact with a surface of the protective member, and
    wherein a third portion between the first portion and the second portion is a region in which material of the first portion and material of the second portion are mixed according to coupling between the end portion of the rod and the washer.

13. The electronic device of claim 11,
wherein a cross-sectional area of an end of the through hole contacting the recess is wider than a cross-sectional area of another end of the through hole in contact with a surface of the protective member, and
wherein the rod is inserted into the through hole from the end of the through hole in a direction toward the another end of the through hole.

14. The electronic device of claim 11,
wherein a melting point of the washer is lower than a melting point of the protective member, and
wherein a difference between the melting point of the washer and a melting point of the protective member is greater than a difference between the melting point of the washer and a melting point of the rod.

15. The electronic device of claim 1, wherein a diameter of an end of the rod in contact with the damper is longer than a diameter of another end of the rod in contact with the fastener.

16. An electronic device comprising:
a housing including a first surface on which a display disposed and a second surface facing the first surface and spaced apart from the first surface;
a protective member including a recess including a through hole and disposed along edges of the display;
a shock absorbing member supported in the recess; and
a washer including an opening aligned with the through hole and disposed on a surface of the protective member facing the recess,
wherein the shock absorbing member includes:
a damper in contact with the recess,
a rod extending from the damper through the through hole and the opening, and
a hook expanding in a radial direction from an end portion of the rod spaced apart from the damper and covering at least part of the through hole.

17. The electronic device of claim 16, wherein a melting point of the washer is greater than a melting point of the rod.

18. The electronic device of claim 16, wherein a cross-sectional area of an end of the through hole contacting the recess is wider than a cross-sectional area of another end of the through hole in contact with a surface of the protective member.

19. The electronic device of claim 16, wherein the rod includes polycarbonate (PC), and wherein the damper includes thermoplastic polyurethane (TPU).

20. The electronic device of claim 16,
wherein the rod is a first rod,
wherein the electronic device further comprises:
a second rod facing away from the first rod, and in contact with the damper,
wherein the through hole is a first through hole, and
wherein the recess further includes a second through hole through which the second rod penetrates and is spaced apart from the first through hole in the recess.

* * * * *